(12) United States Patent
Saitou et al.

(10) Patent No.: US 6,749,899 B2
(45) Date of Patent: Jun. 15, 2004

(54) METHOD FOR PRODUCING PREPREG, PREPREG, METAL CLAD LAMINATE AND PRINTED WIRING BOARD

(75) Inventors: Takeshi Saitou, Shimodate (JP); Akinori Hanawa, Shimotsuma (JP); Takashi Matsuzaki, Kawachi-gun (JP); Morimichi Sudou, Makabe-gun (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/220,426

(22) PCT Filed: Mar. 2, 2001

(86) PCT No.: PCT/JP01/01632

§ 371 (c)(1),
(2), (4) Date: Sep. 3, 2002

(87) PCT Pub. No.: WO01/64411

PCT Pub. Date: Sep. 7, 2001

(65) Prior Publication Data

US 2003/0094232 A1 May 22, 2003

(30) Foreign Application Priority Data

| Mar. 3, 2000 | (JP) | 2000-063357 |
| Mar. 17, 2000 | (JP) | 2000-081836 |
| Mar. 17, 2000 | (JP) | 2000-081837 |

(51) Int. Cl.[7] ................................................ B05D 3/02
(52) U.S. Cl. .................................................... 427/389.8
(58) Field of Search ........................................ 427/389.8

(56) References Cited

U.S. PATENT DOCUMENTS

4,372,800 A   2/1983 Oizumi et al. ............... 427/411

FOREIGN PATENT DOCUMENTS

| CA | 2040655 | * 10/1991 |
| JP | 56-161121 | 12/1981 |
| JP | 60-83839 | 5/1985 |
| JP | 2-182408 | 7/1990 |
| JP | 7-290453 | 11/1995 |
| JP | 11-268036 | * 10/1999 |
| JP | 2000-264985 | * 9/2000 |
| JP | 2000-265368 | 9/2000 |

OTHER PUBLICATIONS

Martin et al, Polymer Composites, 18(1), pp 90–99, 1997.*
Hayes et al, Composites, Part A:Applied Science and Manufacturing, 28 A(9–10), pp 791–799, 1997.*

* cited by examiner

Primary Examiner—Erma Cameron
(74) Attorney, Agent, or Firm—Antonelli, Terry, Stout & Kraus, LLP

(57) ABSTRACT

There are disclosed a method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by moving the fiber base material into which the thermosetting resin varnish is impregnated with a tensile force of 3.0 N/cm or less; and a prepreg prepared by the method.

25 Claims, 2 Drawing Sheets

METHOD FOR PRODUCING PREPREG, PREPREG, METAL CLAD LAMINATE AND PRINTED WIRING BOARD

This application is the National Stage of international application PCT/JP01/01632, filed Mar. 2, 2001.

TECHNICAL FIELD

This invention relates to a method of preparing a prepreg, a prepreg, a metal clad laminated board and a printed wiring board.

BACKGROUND ART

In general, a prepreg to be used for a printed wiring board is prepared by impregnating a thermosetting resin varnish in which a thermosetting resin is diluted by an organic solvent into a glass woven fabric or glass non-woven fabric, and then, vaporizing the solvent in a drying oven to cure the thermosetting resin to a B-stage state. These impregnation process and the drying step are a series of steps in an impregnation machine, and the thermosetting resin varnish is impregnated into a belt-shaped glass woven fabric or glass non-woven fabric, and the impregnated glass woven fabric or glass non-woven fabric is dried in a drying oven.

The impregnation process of impregnating the thermosetting resin varnish into a glass woven fabric or glass non-woven fabric is to carry out by immersing the glass woven fabric or glass non-woven fabric into the thermosetting resin varnish, and then, passing the impregnated material through the gap of squeeze rolls to measure an amount of the thermosetting resin varnish.

In the drying step in which the solvent is vaporized and the resin is cured, a vertical type drying oven is generally used in the case of the glass woven fabric or glass non-woven fabric. It has been generally carried out that, after impregnating the thermosetting resin varnish into a substrate to be conveyed, the impregnated material is passed through the gap of squeeze rollers to the vertical direction, and moved by tensile force of drawing rollers at the outlet of the drying oven in the vertical type drying oven to the vertical direction, and the resin is cured to a B-stage state.

However, in the above-mentioned vertical type drying oven, when the glass woven fabric or glass non-woven fabric impregnated with the thermosetting resin varnish is dried, it is necessary to move the glass woven fabric or glass non-woven fabric at upward, and for moving the glass woven fabric or glass non-woven fabric, a large tension is required. That is, in the vertical type drying oven, a tension is required to move the glass woven fabric or glass non-woven fabric to upward contrary to gravity and the tension is to be acted on the glass woven fabric or glass non-woven fabric by drawing rolls provided at the outlet of the vertical type drying oven. Since the resin is cured while applying the tension thereto, the tension is remained in the prepreg as a strain.

When a metal clad laminated board is prepared by using the prepreg having the residual strain, the residual strain causes bad effects and there is a problem that dimensional stability or warp characteristic of the metal clad laminated board is lowered. Also, when the prepreg is used as a prepreg for adhering multiple layers, the same problem arises.

The present invention has accomplished to solve the above-mentioned problems, and an object thereof is to provide a method of preparing a prepreg having a little residual strain, the prepreg prepared by the preparation method, and a metal clad laminated board and a printed wiring board using the same, which have high dimensional stability.

SUMMARY OF THE INVENTION

The present invention relates to the following method of preparing a prepreg and a prepreg prepared by the same, and a metal clad laminated board and a printed wiring board using the same.

1. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein said drying step is carried out by moving the fiber base material into which the thermosetting resin varnish is impregnated with a tensile force of 3.0 N/cm or less.

2. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by moving the fiber base material into which the thermosetting resin varnish is impregnated to a horizontal direction.

3. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by using a horizontal drying oven with a temperature at an inlet portion of the drying oven lower than a softening point of the resin.

4. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by moving the fiber base material into which the thermosetting resin varnish is impregnated to a horizontal direction, and by heating the fiber base material firstly at a temperature lower than a softening point of the resin.

5. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by using a horizontal drying oven having gas injection nozzles in the drying oven provided at top and bottom alternately.

6. A method of preparing a prepreg comprising the steps of a impregnation process in which a thermosetting resin varnish is impregnated into a fiber base material and a drying step in which a solvent of the impregnated thermosetting resin varnish in the fiber base material is vaporized and the resin is semi-cured, wherein the drying step is carried out by moving the fiber base material into which the thermosetting resin varnish is impregnated to a horizontal direction, and the fiber base material is supported by blowing a gas from top and bottom alternately to the fiber base material and stabilized.

7. The method of preparing a prepreg according to the above 1 to 6, wherein a tensile force A to move the fiber base material, a gas injecting force B to support the base material and a combined force F thereof have the relationship that an angle θ formed by the tensile force A and the combined force F is 18 to 60°.

8. The method of preparing a prepreg according to any one of the above 1 to 7, wherein the fiber base material into which the thermosetting resin varnish is impregnated is passed through the drying oven in the drying step.

9. The method of preparing a prepreg according to any one of the above 1 to 8, wherein the fiber base material is a belt-shaped material.

10. The method of preparing a prepreg according to any one of the above 1 to 9, wherein a difference between a prepreg dimension y (mm) and a fiber base material width dimension x (mm) as a starting material satisfies the equation (1):

$$0.3(\%) \geq (x-y)/x \times 100 \qquad (1).$$

11. The method of preparing a prepreg according to any one of the above 1 to 10, wherein the fiber base material is a glass woven fabric or a glass non-woven fabric.

12. The method of preparing a prepreg according to any one of the above 1 to 11, wherein the fiber base material comprises a woven fabric and a relationship between a gas permeability q (cc/cm$^2$/sec) and a thickness z ($\mu$m) satisfies the equation (4):

$$q \leq -0.1z + 25 \qquad (4).$$

13. The method of preparing a prepreg according to any one of the above 1 to 11, wherein the fiber base material comprises a non-woven fabric and its weighing is 30 to 100 g/m$^2$.

14. A prepreg prepared by any one of the methods according to any one of the above 1 to 13.

15. A metal clad laminated board which comprises the prepreg according to the above 14 or a laminated material thereof and a metal foil laminated on at least one surface of the above material under heating and pressure, and subjected to molding.

16. A printed wiring board which comprises applying a circuit processing to the metal clad laminated board according to the above 15.

BEST MODE FOR CARRYING OUT THE INVENTION

In the present invention, a tensile force applied to a fiber base material into which a thermosetting resin varnish is impregnated in the drying step is preferably adjusted particularly to 3.0 N/cm or less. According to this adjustment, warpage or dimensional change of a metal clad laminated board or a printed wiring board prepared by using a prepreg obtained by the above procedure can be made small. The above-mentioned tensile force is more preferably adjusted to 2.5 N/cm or less.

In the present invention, in the drying step, it is particularly preferred that drying is carried out by moving a fiber base material into which a thermosetting resin varnish is impregnated in a drying oven.

In the present invention, in the drying step, it is preferred to move or transfer a fiber base material into which a thermosetting resin varnish is impregnated to a horizontal direction.

In the present invention, the fiber base material can be moved to the horizontal direction, so that a tensile force applied to the fiber base material into which the thermosetting resin varnish is impregnated can be reduced. Thus, warpage or dimensional change of a metal clad laminated board or a printed wiring board prepared by using a prepreg obtained according to the present invention can be made small.

In the present invention, to make the tensile force small as mentioned above, it is preferred to utilize an injection force of a gas to support the fiber base material in the drying step. In this case, the gas is preferably injected not only from the bottom side but also from the upper side to stabilize the fiber base material, so that it is not hanging over. As a gas which can be used in the present invention, air or an inert gas such as a nitrogen gas, etc., is preferred.

A temperature in the drying step or a temperature in the drying oven is preferably a softening temperature or higher and 200° C. or lower, particularly preferably at a temperature range of 150 to 200° C. Drying of the fiber base material into which the thermosetting resin varnish had been impregnated is preferably carried out by exposing it in the above temperature atmosphere for 1 to 15 minutes.

An initial temperature of the drying step or an inlet temperature of the drying oven is preferably set to less than a softening temperature of the resin. Also, when volatilization of a solvent and temperature stability are considered, the initial temperature of the drying step or an inlet temperature of the drying oven is preferably 50° C. or higher. It is preferred to retain the fiber base material into which the thermosetting resin varnish had been impregnated so that the solvent is sufficiently volatilized and removed at a temperature less than the softening point of the resin. For such a retention time, 2 to 15 seconds are sufficient. Also, as a solvent to be used for the thermosetting resin varnish, an easily volatilizable solvent in comply with this object is preferred.

Figure 1:
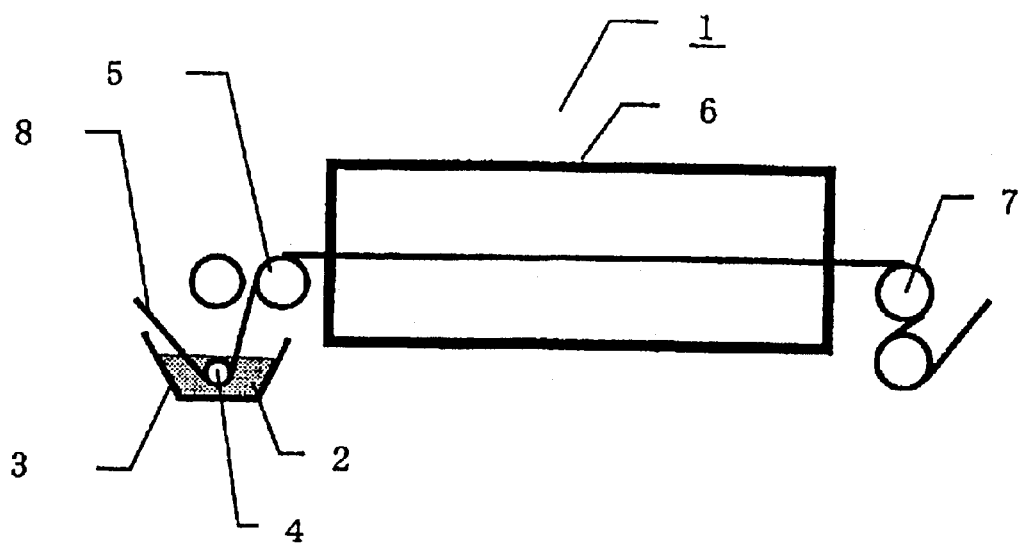
FIG. 1 is an outline view of an example of a horizontal type prepreg-preparation device to be used for producing the prepreg according to the present invention.

A horizontal type drying oven to be used in the present invention is explained by referring to the drawings. FIG. 1 is an outline view of an example of a horizontal type prepreg-preparation device to be used for producing the prepreg according to the present invention. A prepreg horizontal type preparation device 1 has an impregnation tank 3 into which a thermosetting resin varnish 2 is charged, an impregnation roller 4 in the impregnation tank 3, squeeze rollers 5 which also act as feeding rollers, a horizontal type drying oven 6, and drawing rollers 7. A fiber base material 8 such as a belt-shaped glass woven fabric or glass non-woven fabric, etc. to be conveyed is impregnated with the thermosetting resin varnish 2 by passing it under the impregnation roller 4 in the impregnation tank 3, and then, it is passed through a gap between the squeeze rollers 5 and horizontally moved in the horizontal type drying oven 6 and drawn out by the drawing rollers 7. In the horizontal type drying oven 6, the thermosetting resin is cured to a B-stage state to prepare a prepreg. The prepreg taken out from the horizontal type drying oven 6 is wound by the drawing rollers 7 or by a winding roller after passing through the drawing rollers 7, or cut to a predetermined size after passing through the drawing rollers 7. In the horizontal type drying oven 6, it is preferred to blow up a gas such as air, etc. from the bottom side to support the fiber base material 8. In this case, to stabilize the base material without waving, a gas such as air is preferably blown from top side. Also, in the horizontal type drying oven 6, rollers, etc., may be used to support the fiber base material.

In the present invention, injection nozzles of a gas from top and bottom side are preferably arranged so that they are alternately provided at the top and bottom portion to the moving direction of the fiber base material.

Also, in the horizontal type drying oven to be used in the present invention, it is preferred that gas injection nozzles are so arranged that they are alternately provided at the top and bottom portion and the fiber base material is passed through the drying oven between the top side gas injection nozzles and the bottom side gas injection nozzles. An injection force is preferably a wind velocity of 5 to 15 m/sec from the bottom side gas injection nozzle and that of 60 to 80% of the above from the top side gas injection nozzle. The injection force from the bottom side is to support the fiber base material and that from the top side is to control waving of the fiber base material. Also, a wind amount from the bottom side gas injection nozzle is preferably 200 to 400 Nm$^3$/min, and a wind amount from the top side gas injection nozzle is preferably 60 to 80% of the above. Moreover, the direction of a gas to be injected from the gas injection nozzle is not particularly limited, and it may be a vertical direction or an inclined direction.

By making the arrangement as mentioned above, in the drying step, the fiber base material is so supported that it draws like a sign curve so that a tension applied to the fiber base material can be reduced whereby a residual strain acting on the glass woven fabric can be made little.

Figure 2:
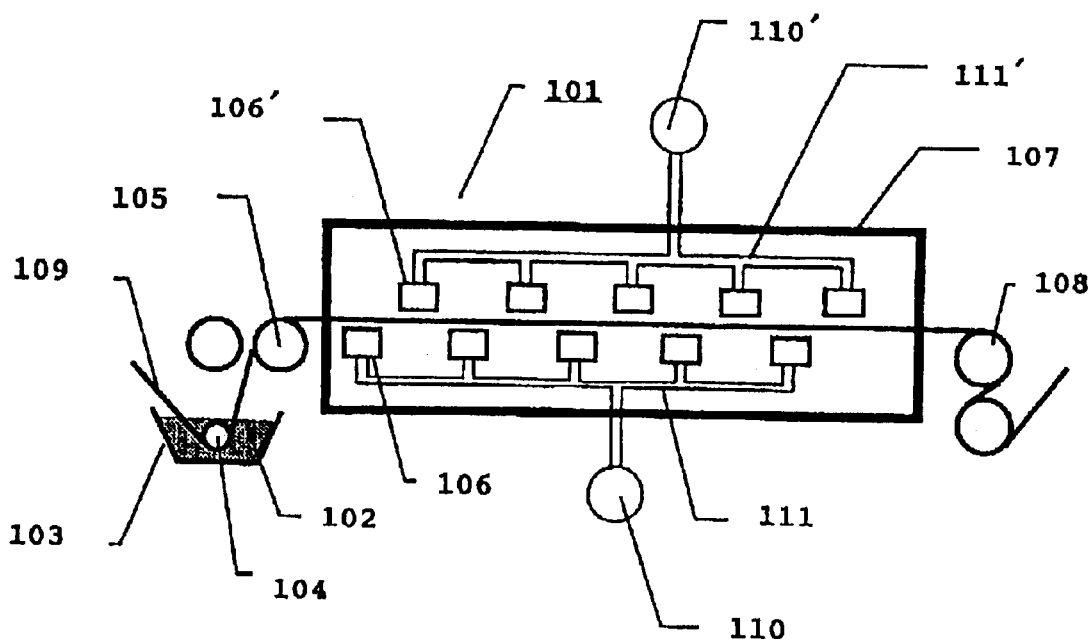
FIG. 2 is an outline view of another example of a horizontal type prepreg-preparation device to be used for producing the prepreg according to the present invention.

Explanation will be made in more detail by referring to the drawings. FIG. 2 is an outline view of another example of a horizontal type prepreg-preparation device to be used for producing the prepreg according to the present invention. A prepreg horizontal type preparation device 101 has an impregnation tank 103 into which a thermosetting resin varnish 102 is charged, an impregnation roller 104 in the impregnation tank 103, squeeze rollers 105 which also act as feeding rollers, a horizontal type drying oven 107 having bottom side injection nozzles 106 and the top side injection nozzles 106', and drawing rollers 108. A fiber base material 109 such as a belt-shaped glass woven fabric or glass non-woven fabric, etc. to be conveyed is impregnated with the thermosetting resin varnish 102 by passing it under the impregnation roller 104 in the impregnation tank 103, and then, it is passed through a gap between the squeeze rollers 105 and horizontally moved in the horizontal type drying oven 107 and drawn out by the drawing rollers 108. In the horizontal type drying oven 107, as shown in FIG. 2, the bottom side injection nozzles 106 and the top side injection nozzles 106' are alternately provided, and the fiber base material 109 moving in the horizontal type drying oven 107 is supported by the gas injected from the nozzles. According to this, waving of the fiber base material 109 can be stabilized by injection of the gas from the top side injection nozzles 106'. Also, in the horizontal type drying oven 107, the thermosetting resin is cured to a B-stage state to prepare a prepreg. The prepreg taken out from the horizontal type drying oven 106 is wound by the drawing rollers 108 or by a winding roller after passing through the drawing rollers 108, or cut to a predetermined size after passing through the drawing rollers 108.

To the bottom side injection nozzles 106 and the top side injection nozzles 106', a gas is fed from blowers 110 and 110' through pipings 111 and 111'.

The gas in the drying oven is preferably injected with a blowing rate of 5 m/min to 15 m/min from the bottom side injection nozzle to support the fiber base material.

Gas injection is carried out or the nozzles therefor are provided usually with a distance of 0.5 to 1.0 m [hereinafter referred to as "a distance (a)"], and a width of the nozzle [a shorter width (hereinafter referred to as "a nozzle width (b)"] is generally 0.15 to 0.30 m, and it is preferred to make an angle to the gas injection surface of the nozzle to draw a sign curve of the fiber base material uniformly. Also, at the gas injection surface of the nozzle, openings may be provided on the whole surface but it is preferred to provide a number of holes such as slits, small round holes, etc., since the gas can be injected uniformly. A longer width of the nozzle, i.e., a length (d), is preferably the same with or longer than the width of the fiber base material. Also, a distance (c) of the up and down direction between the top and bottom gas injection nozzles is usually 0 to 200 mm, and preferably 50 to 100 mm to avoid contacting the nozzle with the fiber base material. An injection force is preferably a wind velocity of 5 to 15 m/sec from the bottom side gas injection nozzle and that of 60 to 80% of the above from the top side gas injection nozzle. The injection force from the bottom side is to support the fiber base material and that from the top side is to control waving of the fiber base material. Also, a wind amount from the bottom side gas injection nozzle is preferably 200 to 400 Nm$^3$/min, and a wind amount from the top side gas injection nozzle is preferably 60 to 80% of the above. Moreover, the direction of a gas to be injected from the gas injection nozzle is not particularly limited, and it may be a vertical direction or an inclined direction.

Figure 3A:
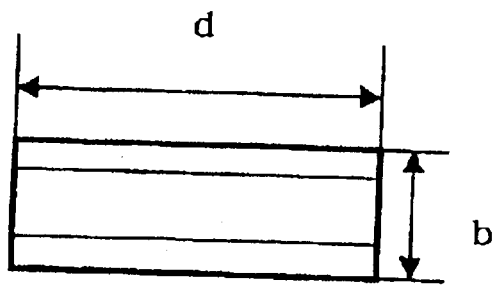
FIG. 3 is a drawing showing one example of an injection nozzle in the present invention.
Figure 3B:
Figure 3C:
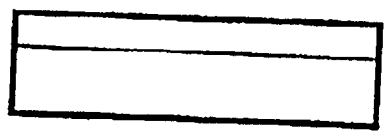

A size or an arrangement of the above-mentioned nozzles is explained by referring to the drawings. FIG. 3 is a drawing showing one example of an injection nozzle to be used in the present invention. FIG. 3(A) is a plan view, FIG. 3(B) is a side view and FIG. 3(C) is a front view. In FIG. 3(A), an injection surface is shown, and to the surface are perforated round (circular shape) holes each having a diameter of 10 mm (which are not shown in the drawing) so that a center distance of the circle of 20 mm at top and bottom and right and left. Also, a nozzle width (b) and a length (d) thereof are shown. Moreover, as can be seen from FIG. 3(B), a tapered surface is provided at the injection surface of the nozzle.

Figure 4:
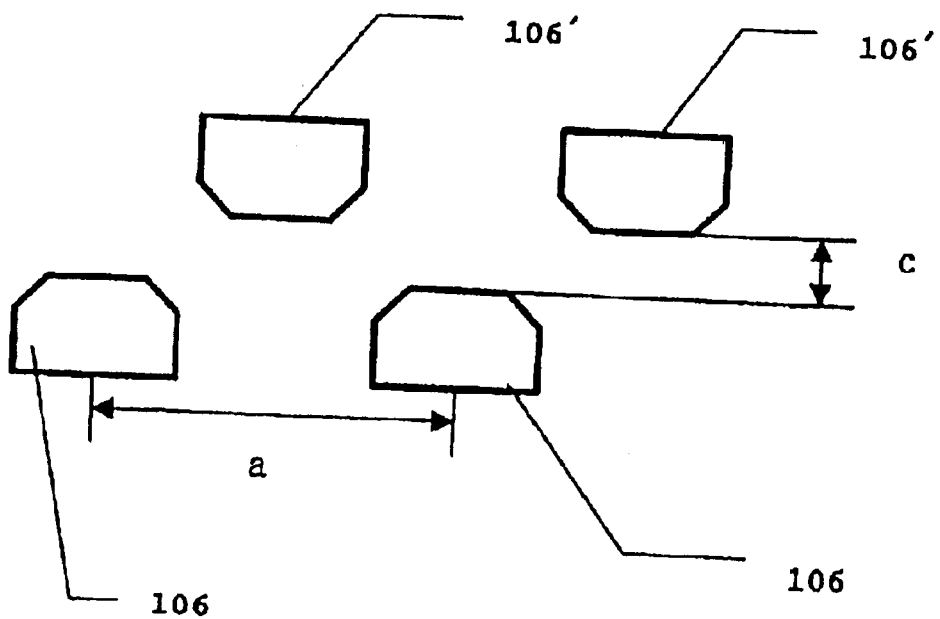
FIG. 4 is an outline view showing an arrangement of gas injection nozzles at top and bottom side.

FIG. 4 is an outline view showing an arrangement of gas injection nozzles at top and bottom side when the nozzle as shown in FIG. 3 is used. In this drawing, the above-mentioned distance (a) and distance (c) are shown. The top side injection nozzles are preferably provided so that they are substantially just in between the bottom side injection nozzles adjacent to each other, but they may be somewhat shifted from the position.

In the present invention, the length of the drying step or the drying oven may vary depending on the moving rate of the fiber base material into which the thermosetting resin is impregnated, a temperature of the drying oven, etc., and so adjusted that the thermosetting resin becomes a semi-cured state after passing the above, particularly in a B-stage state.

In the present invention, the temperature at the drying step or the temperature in the drying oven is preferably a softening temperature of the resin or more to 200° C. or lower, particularly preferably 150 to 200° C. Drying of the fiber base material into which the thermosetting resin is impregnated is preferably carried out by exposing it in the temperature atmosphere for 1 to 15 minutes.

Also, in the present invention, an initial temperature of the drying step or an inlet temperature of the drying oven is preferably less than a softening temperature of the resin. Also, when temperature stability is considered, it is preferably 50° C. or higher.

In the present invention, it is preferred that the fiber base material is moved to the horizontal direction during the drying step or in the drying oven by a feeding roller positioned at before the inlet of the drying step or the drying oven and a drawing roller positioned at after the outlet of the drying step or the drying oven. For this purpose, a feeding roller may be specially provided or a squeeze roller may have a role of the feeding roller. Also, as for the drawing roller, a drawing roller may be specially provided or a wounding roller may have a role of the drawing roller.

A rotation rate of a feeding roller and a rotation rate of a drawing roller are so adjusted that a tensile force applied to the fiber base material into which a thermosetting resin varnish had been impregnated in the drying oven is cancelled or made a little. According to this procedure, a tensile force applied to the fiber base material can be made little so that a residual strain acting on the fiber base material can be made little. Moreover, a rotation rate of the feeding roller is preferably set to 95 to 105% of a rotation rate of the drawing roller. The feeding roller (especially when the squeezing roller is used as the feeding roller) slips by the varnish so that a rotation rate of the feeding roller is particularly preferably set to 100 to 105% of a rotation rate of the drawing roller. Also, a rotation rate of the drawing roller and a rotation rate of the feeding roller are more preferably adjusted so that a tensile force applied to the fiber base material into which a thermosetting resin varnish had been impregnated becomes 3.0 N/cm or less, particularly preferably 2.5 N/cm or less.

The difference between a prepreg dimension y (mm) and the fiber base material width dimension x (mm) as a starting material is preferably so adjusted that it satisfies the conditions of the above-mentioned formula (1), and can be adjusted by the procedure as mentioned above. This means that the width of the fiber base material is the same or similar value as the width of the fiber base material at which a thermosetting resin varnish is impregnated. When the fiber base material into which a thermosetting resin varnish has been impregnated is moved in the drying oven, if a tensile force is applied to the moving direction of the fiber base material, then the fiber base material is elongated to the moving direction. As a result, a width direction of the fiber base material is shrunk but by adjusting the conditions to satisfy the above-mentioned formula (1), the degree of shrinkage can be made little, and a residual strain of the resulting prepreg can be further reduced.

Also, in the present invention, in a tensile force A to move the fiber base material, a gas injecting force B to support the base material and a combined force F thereof, an angle $\theta$ (degree) formed by the tensile force A and the combined force F preferably satisfies the following formula (2), particularly satisfies the following formula (3). This means that the tensile force A and the floating force by the gas injecting force B can be set to a preferred value by the weight or thickness of the prepreg, and further can be optimized by these. In particular, when the thickness of the fiber base material is thin, if a tensile force is acted on the fiber base material, it is elongated to a moving direction to become a strain large. Thus, to solve the problem, $\theta$ preferably satisfies the following formula.

$$18 < \theta < 60 \tag{2}$$

$$20 < \theta < 55 \tag{3}$$

The fiber base material of the present invention is a woven fabric or non-woven fabric such as glass fiber, organic fiber, etc. As the fiber base material, a belt-shaped material is preferably used in the point of easiness in handling.

Also, when the fiber base material into which the thermosetting resin is impregnated is moved in the drying oven, the thermosetting resin varnish attached to the fiber base material transfers to the bottom side of the fiber base material by gravity. Thus, to give a retention force to the fiber base material comprising a woven fabric and to regulate the resin attached amounts at the front and back portions of the prepreg uniform, it is preferred to satisfy a relationship between a gas permeability q ($cc/cm^2/sec$) and a thickness z ($\mu$m) of the fiber base material satisfies the following equation (4):

$$q \leq -0.1z + 25 \tag{4}$$

The thickness of the fiber base material may vary depending on the material itself, and preferably 50 to 200 $\mu$m. In the present invention, the gas permeability is measured according to JIS R 3420.

Accordingly, the metal clad laminated board or the printed wiring board prepared by using the prepreg has particularly small warpage or dimensional change. When the above-mentioned prepreg is used as a prepreg for a multi-layer adhesion, the same effects can be obtained.

On the other hand, a fiber base material comprising a non-woven fabric has good resin-retaining property, so that it is not necessary to consider unevenness of the resin attached amount at the front and back surfaces of the prepreg as mentioned above. A weighing of the fiber base material comprising a non-woven fabric is preferably 30 to 100 $g/m^2$ and a thickness is preferably 250 to 750 $\mu$m.

As the thermosetting resin to be used in the present invention, there may be applied to an epoxy resin, a phenol resin, a polyimide resin, a polyester resin, a cyanate ester resin, a resin having a benzoxazine ring, and a thermosetting resin having a triazine ring, and an epoxy resin is particularly preferred in the points of heat resistance and water-absorption ratio.

As the epoxy resin, an epoxy resin which is a bi-functional or more may be used. For example, there may be mentioned a bisphenol A type epoxy resin, a bisphenol F type epoxy resin, a bisphenol S type epoxy resin, an alicyclic epoxy resin, a phenol-novolak type epoxy resin, a cresol-novolak type epoxy resin, a bisphenol A novolak type epoxy resin, a glycidyl etherified product of a polyfunctional phenol, a diglycidyl etherified product of a polyfunctional alcohol, a hydrogenated product of the above-mentioned materials, etc. These materials are usually used singly but may be used in combination of two or more kinds.

As a curing agent, it is not particularly limited so long as it has conventionally been used as a curing agent of an epoxy resin in the field of electric insulating material, and there may be used, for example, an amine, a phenol and an acid anhydride, etc. In the following, specific compounds are exemplified. As an amine, there may be mentioned diethylamine, diethylenetriamine, triethylenetetramine, diethylaminopropylamine, aminoethylpiperazine, menthenediamine, methaxylylenediamine, dicyanediamide, diaminodiphenylmethane, diaminodiphenylsulfone, methylenedianiline, methaphenylenediamine, etc. As a phenol, there may be mentioned bisphenol, bisphenol A, bisphenol F, a phenol-novolak resin, a cresol-novolak resin, a bisphenol A-novolak resin, and an alkyl group substituted product of the above, etc. As an acid anhydride, there may be mentioned hexahydrophthalic anhydride, tetrahydrophthalic anhydride, pyromellitic anhydride, chlorendic anhydride, nadic anhydride, methylnadic anhydride, dodecynylsuccinic anhydride, phthalic anhydride, methylhexahydrophthalic anhydride, maleic anhydride, etc. These materials are usually used singly but may be used in combination of two or more kinds.

As an epoxy resin, a novolak type epoxy resin such as a phenol-novolak type epoxy resin, a cresol-novolak type epoxy resin, a bisphenol A-novolak type epoxy resin, etc., and as a curing agent, a novolak type phenol resin such as a phenol-novolak resin, a cresol-novolak resin, a bisphenol A-novolak resin, etc., are preferably used in combination since heat resistance of the cured product is excellent.

The curing agent is formulated in an amount of 0.8 to 1.2 equivalent of a functional group in the curing agent based on 1 equivalent of an epoxy group in the epoxy resin, preferably in the range of 0.85 to 1.1 equivalent. If the amount of the functional group in the curing agent is less than 0.8 equivalent or if it exceeds 1.2 equivalent, the glass transition temperature of the resulting material becomes low and likely hygroscopic so that heat resistance is lowered.

To the above-mentioned epoxy resin and the curing agent, a curing accelerator is further added, if necessary. As the curing accelerator, it is not particularly limited so long as it is a compound having a catalytic function which accelerates the etherifying reaction of the epoxy group and the phenolic hydroxyl group. There may be mentioned, for example, an alkali metal compound, an alkaline earth metal compound, an imidazole compound, an organic phosphor compound, a secondary amine, a tertiary amine, a quaternary ammonium salt, etc. An imidazole in which an imino group is masked by acrylonitrile, isocyanate, melamine acrylate, etc. is preferably used since a prepreg having twice or more of preservation stability than the conventional material can be obtained.

These curing accelerators may be used in combination of several kinds. An amount thereof to be formulated is preferably 0.01 to 5 parts by weight based on 100 parts by weight of the epoxy resin. If it is less than 0.01 part by weight, curing acceleration effect tends to be lowered, while if it exceeds 5 parts by weight, preservation stability tends to be worsened.

As the above-mentioned imidazole compound, there may be mentioned, for example, imidazole, 2-ethylaimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, 2-phenyl-4-methylimidazoline, etc. As the masking agent, there may be mentioned, for example, acrylonitrile, phenylene diisocyanate, toluidine diisocyanate, naphthalene diisocyanate, methylenebisphenyl isocyanate, melamine acrylate, etc.

To the thermosetting resin, an inorganic filler such as aluminum hydroxide, clay, etc., may be added, if necessary. Moreover, if necessary, other compounds may be formulated in the range which does not interfere with the effect of the present invention.

The above-mentioned thermosetting resin and the other components are used as a varnish by dissolving or dispersing in a solvent. As the solvent to be used, there may be mentioned a ketone type solvent such as acetone, methyl ethyl ketone, methyl isobutyl ketone, etc.; an aromatic hydrocarbon type solvent such as toluene, xylene, etc.; an ether type solvent such as ethyl acetate, etc.; an amide type solvent such as N,N-dimethylacetamide, etc., an alcohol type solvent such as methanol, ethanol, etc. These solvents may be used singly or in combination of two or more kinds. A solid concentration of the varnish is preferably adjusted to 50 to 80% by weight.

An impregnation method of the thermosetting resin varnish into the fiber base material is not particularly limited, and it is preferred to pass the fiber base material through a tank in which the thermosetting resin varnish is filled. At this time, a resin attached amount to the fiber base material is preferably 35 to 60% by weight in terms of the varnish solid component based on the total amount of the varnish solid component and the base material.

The obtained prepreg is, after cutting it to a predetermined size, alone or laminating optionally two or more sheets, and overlapping with a metal foil or foils on one surface or both surfaces of the prepreg(s), and molding the laminated material under heating and pressurizing, whereby a metal foil clad laminated board can be obtained. As the conditions at this time, a heating temperature is preferably 150 to 230° C. and a pressure of 2 to 5 MPa, and the laminated material is preferably exposed to the above conditions for 0.5 to 2.0 hours.

As the metal foil, a copper foil, an aluminum foil, etc. can be used. A thickness of the metal foil may vary depending on the use thereof, and that of 5 to 100 μm is suitably used.

A printed wiring board can be prepared by applying a circuit processing to the metal foil of the metal foil clad laminated board. The circuit processing can be carried out by, for example, after forming a resist pattern on the surface of the metal foil, removing the foil at an unnecessary portion by etching, peeling the resist pattern, forming a necessary through holes by drilling, forming a resist pattern again, applying a plating for connection of the through holes, and finally removing the resist pattern. On the surface of the printed wiring board, a metal foil-laminated prepreg is further laminated according to the same conditions as the formation of the above-mentioned metal foil clad laminated board, and the same circuit processing procedure is carried out to form a multi-layered printed wiring board. In this case, a through hole(s) is/are not necessarily formed, and a via hole(s) may be formed or the both holes may be formed. Such a multi-layered lamination may be carried out with a necessary number of sheets.

In the present invention, a prepreg having a little residual strain can be obtained by adjusting a tensile force during the drying step, moving the fiber base material to the horizontal direction and carrying the same by an injection force of a gas.

In a horizontal type drying oven, when a woven fabric into which a thermosetting resin varnish had been impregnated is dried, if a temperature at an inlet of the drying oven is set at a softening temperature of the resin or higher, the resin is rapidly softened, easily moved on the surface of the woven fabric and cured at that state. Thus, there is a fear of fluctuating an amount of the resin attached to the fiber base material at the front and back surfaces thereof. When a prepreg a resin attached amount of which is markedly fluctuated is employed for producing a metal clad laminated board, there are problems that surface smoothness, plate thickness precision and warpage characteristics of the metal clad laminated board are lowered. In the present invention, lowering in viscosity of the resin is controlled by making an initial temperature of the drying step or an inlet temperature of a horizontal type drying oven a softening temperature of the resin or lower. Accordingly, fluidization of the resin at the surface of the woven fabric can be reduced, and then, the resin is cured so that fluctuation of the resin attached amount to the fiber base material at the front and back surfaces thereof can be made little. Thus, a prepreg having less fluctuation in resin attached amount to the fiber base material at the front and back surfaces thereof can be obtained so that a metal clad laminated board and a printed wiring board having excellent surface smoothness, plate thickness precision and warpage characteristics can be obtained.

EXAMPLES

Next, the present invention is explained in more detail below by referring to Examples, but the present invention is not limited by these.

Example 1

In methyl ethyl ketone were dissolved 100 parts by weight of a brominated bisphenol A type epoxy resin (an epoxy equivalent: 480, a bromine content: 21.5% by weight), 2.6 parts by weight of dicyane diamide and 0.2 parts by weight of 2-ethyl-4-methylimidazole to prepare a thermosetting resin varnish having a solid component of 65% by weight. Also, a prepreg horizontal type producing device as shown in FIG. 1 was used. The above-mentioned thermosetting resin varnish is placed in an impregnation tank, and a belt-shaped glass woven fabric having a thickness of 0.20 mm, a gas permeability of 5 cc/cm$^2$/sec and a width of 1.2 m was passed therethrough to impregnate the thermosetting resin varnish into the glass woven fabric. Then, the glass woven fabric into which the thermosetting resin had been impregnated was passed through a drying oven to prepare a prepreg containing 42% by weight of the resin component.

The specification of the drying oven is as follows:

Length of the drying oven: 35 m

Temperature in the drying oven: 70 to 185° C.

Rotation rate of a slide roller: 25 m/min

Rotation rate of a drawing roller: 25 m/min

Tensile force applied to a glass woven fabric into which the thermosetting resin varnish had been impregnated: 2.3 N/cm (immediately before the drawing roller)

Temperature in the drying oven: 70 to 150° C. for 35 seconds and retained at 150 to 185° C. for 50 seconds Incidentally, in the drying oven, to support the fiber base material, air was blown from downward and air was also blown from upward to stabilize the fiber base material.

Example 2

In the same manner as in Example 1 except for changing the tensile force applied to the glass woven fabric into which the thermosetting resin varnish had been impregnated to 3.0 N/cm (immediately before the drawing roller), a prepreg containing 46% by weight of the resin component was prepared.

Example 3

In the same manner as in Example 1 except for changing the tensile force applied to the glass woven fabric into which the thermosetting resin varnish had been impregnated to 1.5 N/cm (immediately before the drawing roller), a prepreg containing 46% by weight of the resin component was prepared.

Example 4

In the same manner as in Example 1 except for using a glass woven fabric having a thickness of 0.20 mm and a gas permeation degree of 3 cc/cm$^2$/sec as the glass woven fabric, a prepreg containing 46% by weight of the resin component was prepared.

Example 5

In the same manner as in Example 1 except for using a glass woven fabric having a thickness of 0.15 mm and a gas permeation degree of 8 cc/cm$^2$/sec as the glass woven fabric, a prepreg containing 46% by weight of the resin component was prepared.

Example 6

In the same manner as in Example 1 except for using a glass woven fabric having a thickness of 0.10 mm and a gas permeation degree of 15 cc/cm$^2$/sec as the glass woven fabric, a prepreg containing 46% by weight of the resin component was prepared.

Example 7

In the same manner as in Example 1 except for using a glass woven fabric having a thickness of 0.10 mm and a gas permeation degree of 10 cc/cm$^2$/sec as the glass woven fabric, a prepreg containing 46% by weight of the resin component was prepared.

Comparative Example 1

In the same manner as in Example 1 except for using a vertical type drying oven as the drying oven and a glass woven fabric having a thickness of 0.10 mm and a gas permeation degree of 5 cc/cm$^2$/sec as the glass woven fabric, a prepreg containing 46% by weight of the resin component was prepared. A size of the vertical type drying oven in this prepreg producing device is a height of 17 m, and the fiber base material is reciprocated through a roller and a length of 34 m is to be existed in the drying oven. Except for the above, the specification was made the same to those shown in FIG. 1. However, Rotation rate of a slide roller: 0.7 m/min Rotation rate of a drawing roller: 25 m/min were employed. To feed the fiber base material stably without fluttering, it was necessary to make the rotation rate of the drawing roller larger than that of the slide roller. The tensile force immediately before the drawing roller was 3.4 N/cm.

Comparative Example 2

In the same manner as in Comparative example 1 except for using a glass woven fabric having a thickness of 0.10 mm and a gas permeation degree of 20 cc/cm$^2$/sec as the glass woven fabric, a prepreg containing 46% by weight of the resin component was prepared. The tensile force immediately before the drawing roller was 3.4 N/cm.

Each of the prepregs prepared in the above-mentioned Examples 1 to 7 and Comparative examples 1 and 2 was cut to a predetermined size, copper foils with a thickness of 18 μm were provided to the both sides, and the material was sandwiched to mirror plates made of stainless having a thickness of 1.8 mm. These constitutional materials were laminated thirteen times, inserted into press hot plates and molded by a multi-step press at a temperature of 185° C. and a pressure of 4 MPa for 85 minutes to prepare a both surfaces copper clad laminated board. Circuit processing was applied to the resulting both surfaces copper clad laminated board according to the conventional manner to prepare a printed wiring board. These performances are shown in Table 1.

TABLE 1

|  | Example 1 | Example 2 | Example 3 | Example 4 | Example 5 | Example 6 | Example 7 | Comparative example 1 | Comparative example 2 |
|---|---|---|---|---|---|---|---|---|---|
| Tensile force (N/cm) | 2.3 | 3 | 1.5 | 2.3 | 2.3 | 2.3 | 2.3 | 3.4 | 3.4 |
| Thickness of fiber base material (μm) | 200 | 200 | 200 | 200 | 150 | 100 | 100 | 200 | 100 |
| Gas permeability of fiber base material (cc/cm²/sec) | 5 | 5 | 5 | 3 | 8 | 15 | 10 | 5 | 20 |
| Drying oven | Horizontal type | Horizontal type | Horizontal type | Horizontal type | Horizontal type | Horizontal type | Horizontal type | Vertical type | Vertical type |
| *Dimensionally changed rate (%) | 0.01 | 0.01 | 0.01 | 0.01 | 0.01 | 0.02 | 0.02 | 0.03 | 0.06 |
| *Warpage amount (mm) | 0.5 | 0.5 | 0.5 | 0.5 | 0.5 | 0.5 | 0.25 | 1 | 1 |

*Marking point was marked at the center portion of a sample having 300 mm × 300 mm, and dimensionally changed rate and warpage by circuit processing to the printed wiring board were measured.

As clearly seen from the results shown in Table 1, characteristics of the copper clad laminated boards of Examples 1 to 7 are superior to those of Comparative examples 1 and 2 in less dimensional change, and in the multi-layered adhesion, they were also less warpage and dimensional change.

Example 8

In methyl ethyl ketone were dissolved 100 parts by weight of a brominated epoxy resin (an epoxy equivalent: 470, a bromine content: 20.5% by weight), 3 parts by weight of dicyane diamide and 0.1 parts by weight of 2-ethyl-4-methylimidazole, and further 85 parts by weight of aluminum hydroxide having an average particle size of 10 μm was added to the mixture as an inorganic filler to prepare a thermosetting resin varnish having a solid component of 83% by weight. In the same manner as in Example 1 except for using the above thermosetting resin varnish and using a glass woven fabric having a thickness of 0.54 mm and a weighing of 73 g/m² as the fiber base material, a prepreg having a varnish solid component of 88% by weight was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.05% and a warpage amount was 0.5 mm.

Example 9

In the same manner as in Example 8 except for using a glass woven fabric having a thickness of 0.41 mm and a weighing of 50 g/m² as the fiber base material, a prepreg having a solid component of 88% by weight was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.05% and a warpage amount was 0.5 mm.

Example 10

In the same manner as in Example 8 except for using a glass woven fabric having a thickness of 0.75 mm and a weighing of 100 g/m² as the fiber base material, a prepreg having a solid component of 88% by weight was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.05% and a warpage amount was 0.5 mm.

Comparative Example 3

In the same manner as in Comparative example 1 except for using the thermosetting resin varnish and the fiber base material used in Example 8, a prepreg was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.1% and a warpage amount was 0.5 mm.

Example 11

In 90 parts by weight of methyl ethyl ketone were dissolved 50 parts by weight of a bisphenol A novolak type epoxy resin (Epicron N-868, trade name, available from Dainippon Ink Kagaku Kogyo K.K., Japan), 40 parts by weight of a bisphenol A novolak type epoxy resin (YLH-129, trade name, available from Yuka Shell Epoxy K.K., Japan), 50 parts by weight of a brominated bisphenol A type epoxy resin (ESB-400, trade name, available from Sumitomo Chemical Kogyo K.K., Japan) and 1 part by weight of 1-cyanoethyl-2-phenylimidazole to prepare a thermosetting resin varnish. In the same manner as in Example 1 except for using the above thermosetting resin varnish and using a glass woven fabric having a thickness of 0.10 mm and a gas permeability of 15 cc/cm²/sec as the fiber base material, a prepreg having a resin component of 50% by weight was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.02% and a warpage amount was 0.5 mm.

Comparative Example 4

In the same manner as in Comparative example 1 except for using the thermosetting resin varnish and the fiber base material used in Example 11, a prepreg was prepared. Then, in the same manner as in Example 1, a both surfaces copper clad laminated board was prepared by using the prepreg, and the resulting material was subjected to circuit processing according to the conventional manner to prepare a printed wiring board. A dimensional changing ratio of the resulting printed wiring board was 0.06% and a warpage amount was 0.5 mm.

Example 12

In methyl ethyl ketone were dissolved 100 parts by weight of a brominated bisphenol A type epoxy resin (an epoxy equivalent: 480, a bromine content: 21.5% by weight, a softening temperature: 80° C.), 2.6 parts by weight of dicyane diamide and 0.2 parts by weight of 2-ethyl-4-methylimidazole to prepare a thermosetting resin varnish having a solid component of 65% by weight. Also, a prepreg horizontal type producing device as shown in FIG. 1 was used. The above-mentioned thermosetting resin varnish is placed in an impregnation tank, and a belt-shaped glass woven fabric having a thickness of 0.20 mm, a gas permeability of 5 cc/cm²/sec and a width of 1.2 m was passed therethrough to impregnate the thermosetting resin varnish into the glass woven fabric. Then, the glass woven fabric into which the thermosetting resin had been impregnated was passed through a drying oven to prepare a prepreg containing 42% by weight of the resin component.

The specification of the drying oven is as follows:

Length of the drying oven: 35 m

Retention time of the glass woven fabric into which the thermosetting resin varnish had been impregnated: 50 seconds Temperature in the drying oven: the drying oven was partitioned to six rooms while a space through which the glass woven fabric into which the thermosetting resin varnish had been impregnated is passed through, and the temperatures of the respective rooms were made constant. The lengths and the temperatures of the respective rooms are as follows.

First room from initial: 4.5 m, 70° C. (Inlet temperature)
Second room from initial: 4.5 m, 100° C.
Third room from initial: 4.5 m, 140° C.
Fourth room from initial: 4.5 m, 180° C.
Fifth room from initial: 6.0 m, 180° C.
Sixth room from initial: 6.0 m, 140° C.

Rotation rate of a slide roller: 25 m/min

Rotation rate of a drawing roller: 25 m/min

Tensile force applied to the glass woven fabric into which the thermosetting resin varnish had been impregnated: 2.3 N/cm (immediately before the drawing roller)

Incidentally, in the drying oven, to support the fiber base material, air was blown from downward and air was also blown from upward to stabilize the fiber base material.

Example 13

In the same manner as in Example 12 except for using a glass woven fabric having a thickness of 0.10 mm and a gas permeation degree of 15 cc/cm²/sec as the glass woven fabric, a prepreg containing 46% by weight of the resin component was prepared.

Example 14

In the same manner as in Example 12 except for setting the drying oven inlet temperature to 150° C. and maintaining the temperatures in the drying oven to 150 to 180° C. in Example 10, a prepreg containing 42% by weight of the resin component was prepared.

Each of the prepregs prepared in the above-mentioned Examples 12 to 14 and Comparative examples 1 and 2 was cut to a predetermined size, copper foils with a thickness of 18 μm were provided to the both sides, and the material was sandwiched to mirror plates made of stainless having a thickness of 1.8 mm. These constitutional materials were laminated thirteen times, inserted into press hot plates and molded by a multi-step press at a temperature of 185° C. and a pressure of 4 MPa for 85 minutes to prepare a both surfaces copper clad laminated board. Circuit processing was applied to the resulting both surfaces copper clad laminated board according to the conventional manner to prepare a printed wiring board. Performances of the both surfaces copper clad laminated boards and the printed wiring boards are shown in Table 2.

TABLE 2

|  | Example 12 | Example 13 | Example 14 | Comparative example 1 | Comparative example 2 |
| --- | --- | --- | --- | --- | --- |
| Thickness of glass woven fabric (mm) | 0.2 | 0.1 | 0.2 | 0.2 | 0.2 |
| Board thickness deviation*1 | 0.0021 | 0.001 | 0.0027 | 0.0015 | 0.0015 |
| Surface smoothness*2 (μm) | 10 | 10 | 20 | 20 | 20 |
| Dimensional change*3 (%) | 0.01 | 0.02 | 0.01 | 0.03 | 0.06 |

TABLE 2-continued

|  | Example 12 | Example 13 | Example 14 | Comparative example 1 | Comparative example 2 |
|---|---|---|---|---|---|
| Warpage amount*3 (mm) | 0.3 | 0.2 | 1.2 | 1 | 1 |

*1Deviation when plate thicknesses were measured at optional 50 points of the both surfaces copper clad laminated board sample having a size of 300 mm × 300 mm.
*2Difference between the maximum value and the minimum value when plate thicknesses were measured at optional 50 points of the both surfaces copper clad laminated board sample having a size of 300 mm × 300 mm.
*3At the center portion of the sample having a size of 300 mm × 300 mm, a marking point was marked and warpage (maximum) at the edge portion and dimensional change by circuit processing to the printed wiring board were observed.

As clearly seen from the results shown in Table 2, the copper clad laminated board samples of Examples 12 to 14 according to the present invention each have less warpage and dimensional change than the samples of Comparative examples 1 and 2 other than the present invention, and warpage and dimensional change at the time of multi-layer adhesion were also confirmed to be little.

Example 15

In methyl ethyl ketone were dissolved 100 parts by weight of a brominated bisphenol A type epoxy resin (a nepoxy equivalent: 480, a bromine content: 21.5% by weight), 2.6 parts by weight of dicyane diamide and 0.2 parts by weight of 2-ethyl-4-methylimidazole to prepare a thermosetting resin varnish having a solid component of 65% by weight. Also, a prepreg horizontal type producing device as shown in FIG. 1 was used. The above-mentioned thermosetting resin varnish is placed in an impregnation tank, and a belt-shaped glass woven fabric having a thickness of 0.20 mm, a gas permeability of 5 cc/cm$^2$/sec and a width of 1.2 m was passed therethrough to impregnate the thermosetting resin varnish into the glass woven fabric. Then, the glass woven fabric into which the thermosetting resin had been impregnated was passed through a drying oven to prepare a prepreg containing 42% by weight of the resin component.

The specification of the drying oven is as follows:
Length of the drying oven: 35 m
Temperature in the drying oven: the drying oven was partitioned to six rooms while a space through which the glass woven fabric into which the thermosetting resin varnish had been impregnated is passed through, and the temperatures of the respective rooms were made constant. The lengths and the temperatures of the respective rooms are as follows.
  First room from initial: 4.5 m, 70° C. (Inlet temperature)
  Second room from initial: 4.5 m, 100° C.
  Third room from initial: 4.5 m, 140° C.
  Fourth room from initial: 4.5 m, 180° C.
  Fifth room from initial: 6.0 m, 180° C.
  Sixth room from initial: 6.0 m, 140° C.
Bottom side gas injection nozzle:
  40 nozzles, distance (a): 0.75 m
  Blow rate of injected gas: 10 m/sec
  Blow amount of injected gas: 230 Nm$^3$/min
  Direction of wind: vertical upper direction
Upper side gas injection nozzle:
  40 nozzles, distance (a): 0.75 m
  Blow rate of injected gas: 8 m/sec
  Blow amount of injected gas: 184 Nm$^3$/min
  Direction of wind: vertical lower direction Arrangement of top and bottom gas injection nozzle: alternate
Distance of top and bottom gas injection nozzle: 60 mm
Length of respective nozzles (d): substantially the same as glass woven fabric
Retention time of the glass woven fabric into which the thermosetting resin varnish had been impregnated: 50 seconds
Temperature in the drying oven: Inlet temperature 70° C. Gradually elevated and at the point of retention time of 35 seconds: 150° C.
  Thereafter: 150 to 185° C.
Rotation rate of a slide roller: 25 m/min
Rotation rate of a drawing roller: 25 m/min
Tensile force applied to the glass woven fabric into which the thermosetting resin varnish had been impregnated: 2.3 N/cm (immediately before the drawing roller, horizontal direction)

θ=40

Incidentally, in the drying oven, to support the fiber base material, air was blown from downward and air was also blown from upward to stabilize the fiber base material.

Example 16

In the same manner as in Example 15 except for adjusting the tensile force to θ=20, a prepreg containing 46% by weight of the resin component was prepared.

Example 17

In the same manner as in Example 15 except for adjusting the tensile force to θ=55, a prepreg containing 46% by weight of the resin component was prepared.

Example 18

In the same manner as in Example 15 except for using a glass woven fabric having a thickness of 0.10 mm and a gas permeation degree of 15 cc/cm$^2$/sec as the glass woven fabric, a prepreg containing 46% by weight of the resin component was prepared.

Example 19

In the same manner as in Example 15 except for making the number of the upper side injection nozzles the same as that of the bottom side injection nozzles, and the upper side injection nozzles were arranged so that they are opposed to the bottom side injection nozzles, a prepreg containing 42% by weight of the resin component was prepared.

Each of the prepregs prepared in the above-mentioned Examples 15 to 19 and Comparative examples 1 and 2 was cut to a predetermined size, copper foils with a thickness of 18 μm were provided to the both sides, and the material was sandwiched to mirror plates made of stainless having a thickness of 1.8 mm. These constitutional materials were laminated thirteen times, inserted into press hot plates and molded by a multi-step press at a temperature of 185° C. and a pressure of 4 MPa for 85 minutes to prepare a both surfaces copper clad laminated board. Circuit processing was applied to the resulting both surfaces copper clad laminated board according to the conventional manner to prepare a printed wiring board. Performances of the both surfaces copper clad laminated boards and the printed wiring boards are shown in Table 3.

TABLE 3

| | Example 15 | Example 16 | Example 17 | Example 18 | Example 19 | Comparative example 1 | Comparative example 2 |
|---|---|---|---|---|---|---|---|
| Arrangement of top and bottom gas injection nozzle | Alternate | Alternate | Alternate | Alternate | Opposed | — | — |
| Thickness of glass woven fabric (mm) | 0.2 | 0.2 | 0.2 | 0.1 | 0.2 | 0.1 | 0.1 |
| Prepreg width shrinkage rate*1 (%) | 0.3 | 0.3 | 0.3 | 0.3 | 0.5 | 0.5 | 0.5 |
| Dimensional change*2 (%) | 0.01 | 0.02 | 0.01 | 0.02 | 0.01 | 0.03 | 0.06 |

*1Prepreg width shrinkage rate was measured by deducting a width of the prepreg from a width of the glass woven fabric as the starting material, and a rate thereof based on the width of the glass woven fabric as the starting material was measured.
*2At the center portion of the sample having a size of 300 mm × 300 mm, a marking point was marked and warpage (maximum) at the edge portion and dimensional change by circuit processing to the printed wiring board were observed.

As clearly seen from the results shown in Table 3, the copper clad laminated board samples of Examples 15 to 19 according to the present invention each have less warpage and dimensional change than the samples of Comparative examples 1 and 2 other than the present invention, and warpage and dimensional change at the time of multi-layer adhesion were also confirmed to be little.

Utilizability in Industry

In the prepreg prepared according to the present invention, residual strain is difficultly caused since a tension applied to the fiber base material can be reduced at the time of preparation thereof. A metal clad laminated board and a printed wiring board prepared by using the same has little warpage and dimensional change. Also, a prepreg in which a resin attached amount to the fiber base material is less fluctuated can be obtained so that a metal clad laminated board and a printed wiring board having excellent surface smoothness, plate thickness precision and warpage characteristics can be produced.

What is claimed is:

1. A method of preparing a prepreg comprising:
   an impregnation step in which a thermosetting resin varnish is impregnated into a glass fiber base material, and
   a drying step in which a solvent of the impregnated thermosetting resin varnish in the glass fiber base material is vaporized and the resin is semi-cured, wherein said drying step is carried out by moving the glass fiber base material, into which the thermosetting resin varnish is impregnated, in a horizontal direction, with a tensile force of 3.0 N/cm or less.

2. A method of preparing a prepreg comprising:
   an impregnation step in which a thermosetting resin varnish is impregnated into a glass fiber base materials, and
   a drying step in which a solvent of the impregnated thermosetting resin varnish in the glass fiber base material is vaporized and the resin is semi-cured, wherein the drying step is carried out by using a horizontal drying oven with a temperature at an inlet portion of the drying oven lower than a softening point of the resin, and moving the glass fiber base material with a tensile force of 3.0 N/cm or less.

3. A method of preparing a prepreg comprising:
   an impregnation step in which a thermosetting resin varnish is impregnated into a glass fiber base materials, and
   a drying step in which a solvent of the impregnated thermosetting resin varnish in the glass fiber base material is vaporized and the resin is semi-cured, wherein the drying step is carried out by moving the glass fiber base material into which the thermosetting resin varnish is impregnated in a horizontal direction, and-by heating the glass fiber base material firstly at a temperature lower than a softening point of the resin, and moving the glass fiber base material with a tensile force of 3.0 N/cm or less.

4. A method of preparing a prepreg comprising:
   an impregnation step in which a thermosetting resin varnish is impregnated into a glass fiber base material, and
   a drying step in which a solvent of the impregnated thermosetting resin varnish in the glass fiber base material is vaporized and the resin is semi-cured, wherein the drying step is carried out by using a horizontal drying oven having gas injection nozzles in the drying oven provided at top and bottom alternately, and moving the glass fiber base material with a tensile force of 3.0 N/cm or less.

5. A method of preparing a prepreg comprising:
   an impregnation step in which a thermosetting resin varnish is impregnated into a glass fiber base material, and a drying step in which a solvent of the impregnated thermosetting resin varnish in the glass fiber base material is vaporized and the resin is semi-cured, wherein the drying step is carried out by moving the glass fiber base material into which the thermosetting resin varnish is impregnated in a horizontal direction and moving the glass fiber base material with a tensile force of 3.0 N/cm or less, and the glass fiber base material is supported by blowing a gas from top and bottom alternately to the glass fiber base material and stabilized.

6. The method of preparing a prepreg according to claim 2, wherein the glass fiber base material into which the thermosetting resin varnish is impregnated is passed through the drying oven in the drying step.

7. The method of preparing a prepreg according to claim 4, wherein the glass fiber base material in which the thermosetting resin varnish is impregnated is passed through the drying oven in the drying step.

8. The method of preparing a prepreg according to claim 1, wherein the glass fiber base material is a belt-shaped material.

9. The method of preparing a prepreg according to claim 1, wherein a difference between a prepreg dimension y (mm) and a glass fiber base material width dimension x (mm) as a starting material satisfies the equation (1):

$$0.3(\%) \geq (x-y)/x \times 100 \qquad (1).$$

10. The method of preparing a prepreg according to claim 1, wherein the glass fiber base material is a glass woven fabric or a glass non-woven fabric.

11. The method of preparing a prepreg according to claim 1, wherein the glass fiber base material comprises a woven fabric, and a relationship between a gas permeability q (cc/cm$^2$/sec) and a thickness z ($\mu$m) satisfies the equation (4):

$$q \leq -0.1z + 25 \qquad (4).$$

12. The method of preparing a prepreg according to claim 1, wherein the glass fiber base material comprises a non-woven fabric and its weight weighing is 30 to 100 g/m$^2$.

13. The method of preparing a prepreg according to claim 1, wherein said tensile force is 2.5 N/cm or less.

14. The method of preparing a prepreg according to claim 1, wherein in the drying step the thermosetting resin is cured to a B-stage state.

15. The method of preparing a prepreg according to claim 4, wherein a gas velocity of the gas blown to the top of the glass fiber base material is 60 to 80% of the gas velocity of the gas blown to the bottom of the glass fiber base material.

16. The method of preparing a prepreg according to claim 2, wherein a temperature during the drying step is in a range from a softening temperature of the resin, up to 200° C.

17. A method of preparing a prepreg comprising:

an impregnation step in which a thermosetting resin varnish is impregnated into a glass fiber base material, and a drying step in which a solvent of the impregnated thermosetting resin varnish in the glass fiber base material is vaporized and the resin is semi-cured, wherein said drying step is carried out by moving the glass fiber base material, into which the thermosetting resin varnish is impregnated, in a horizontal direction, with a tensile force of 3.0 N/cm or less, wherein in the drying step the glass fiber base material is supported by injected gas, the injected gas having a gas injecting force B, and wherein a tensile force A to move the glass fiber base material, the gas injecting force B to support the base material and a combined force thereof F have the relationship that an angle θ formed by the tensile force A and the combined force F is 18 to 60°.

18. The method of preparing a prepreg according to claim 17, wherein the glass fiber base material is a belt-shaped material.

19. The method of preparing a prepreg according to claim 18, wherein a difference between a prepreg dimension y (mm) and a glass fiber base material width dimension x (mm) as a starting material satisfies the equation (1):

$$0.3(\%) \geq (x-y)/x \times 100 \qquad (1).$$

20. The method of preparing a prepreg according to claim 19, wherein the glass fiber base material is a glass woven fabric or a glass non-woven fabric.

21. The method of preparing a prepreg according to claim 20, wherein the class fiber base material comprises a woven fabric, and a relationship between a gas permeability q (cc/cm$^2$/sec) and a thickness z ($\mu$m) satisfies the equation (4):

$$q \leq -0.1z + 25 \qquad (4).$$

22. The method of preparing a prepreg according to claim 20, wherein the glass fiber base material comprises a non-woven fabric and its weight weighing is 30 to 100 g/m$^2$.

23. A prepreg prepared by the method according to claim 22.

24. A metal clad laminated board which comprises the prepreg according to claim 23 or a laminated material thereof and a metal foil laminated on at least one surface of the above material under heating and pressure, and subjected to molding.

25. A printed wiring board which comprises applying a circuit processing to the metal clad laminated board according to claim 24.

* * * * *